US010665515B1

(12) United States Patent
Klein et al.

(10) Patent No.: US 10,665,515 B1
(45) Date of Patent: May 26, 2020

(54) SELECTIVE PER DIE PERFORMANCE BINNING

(71) Applicant: Xilinx, Inc., San Jose, CA (US)

(72) Inventors: Matthew H. Klein, Redwood City, CA (US); Gregory Meredith, Burlingame, CA (US); Joshua Tan, San Jose, CA (US)

(73) Assignee: XILINX, INC., San Jose, CA (US)

( * ) Notice: Subject to any disclaimer, the term of this patent is extended or adjusted under 35 U.S.C. 154(b) by 14 days.

(21) Appl. No.: 16/026,981

(22) Filed: Jul. 3, 2018

(51) Int. Cl.
*H01L 23/58* (2006.01)
*H01L 21/66* (2006.01)
*H01L 27/118* (2006.01)
*G01R 31/317* (2006.01)
*G06F 30/392* (2020.01)

(52) U.S. Cl.
CPC ........ *H01L 22/20* (2013.01); *G01R 31/31704* (2013.01); *G06F 30/392* (2020.01); *H01L 22/34* (2013.01); *H01L 27/11803* (2013.01)

(58) Field of Classification Search
CPC ......... H01L 22/14; H01L 22/20; H01L 22/34; H01L 27/11803; G06F 17/5072
USPC ........................... 257/48, 210, 211, 758, 797
See application file for complete search history.

(56) References Cited

U.S. PATENT DOCUMENTS

| 6,133,582 A * | 10/2000 | Osann, Jr. ............... H01L 22/20 257/210 |
| 6,445,206 B1 * | 9/2002 | Montull ............. G01R 31/2831 257/620 |
| 8,872,536 B1 * | 10/2014 | Trimberger ........ G01R 31/2894 324/757.03 |

* cited by examiner

Primary Examiner — Brook Kebede
(74) Attorney, Agent, or Firm — Patterson + Sheridan, LLP

(57) ABSTRACT

Embodiments herein describe binning and placement techniques for assembling a multi-die device to improve yield when a customer requests a high performance feature from the device. For example, the multi-die device may include multiple dies that are interconnected to form a single device or package. In one embodiment, the multiple dies are the same semiconductor die (e.g., have the same circuit layout) which are disposed on a common interposer or stacked on each other. The multi-die device can then be attached to a printed circuit board (PCB). Although the dies in the multi-die device may each include the same feature (e.g., a PCIe interface, SerDes interface, transmitter, memory interface, etc.), the multi-die device is assembled so that not all of the dies have a feature that satisfies the high performance requested by the customer. That is, at least one of the die includes a lower performance feature.

18 Claims, 4 Drawing Sheets

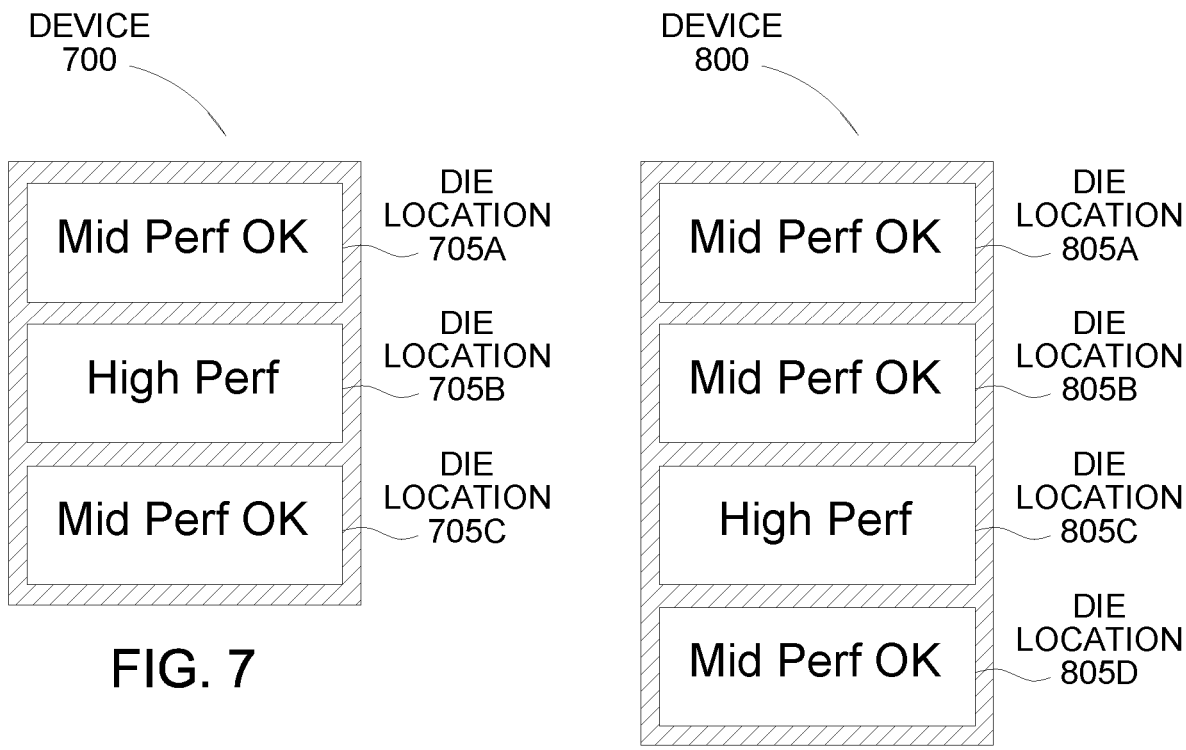
FIG. 7
FIG. 8
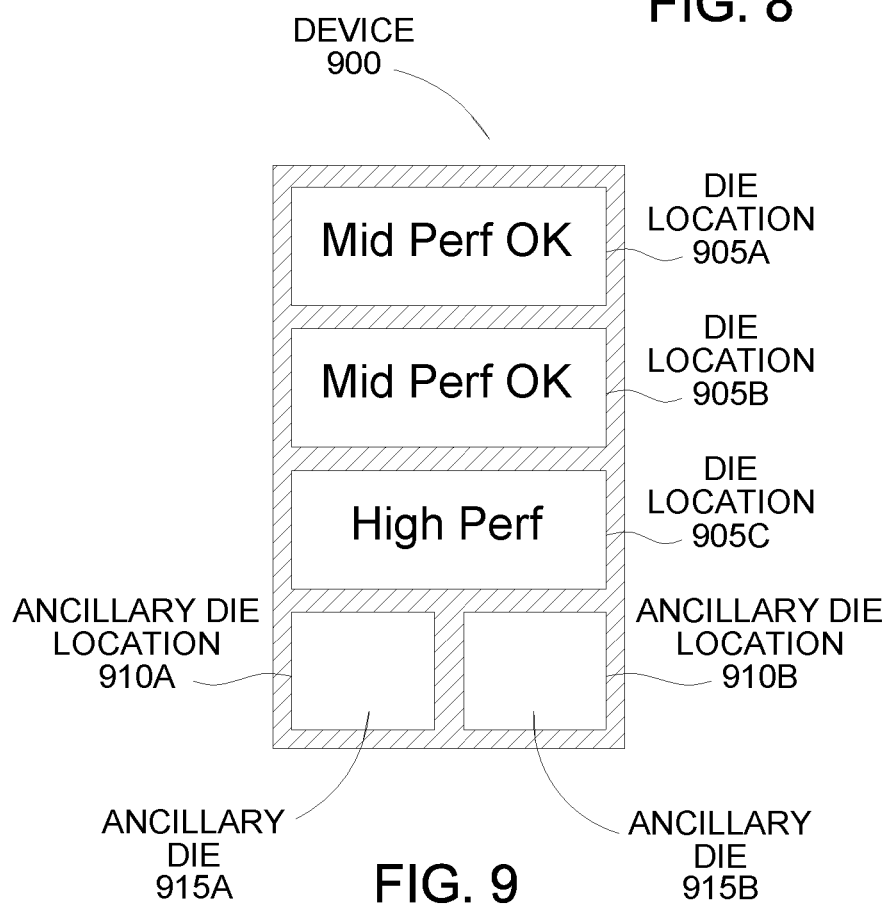
FIG. 9

US 10,665,515 B1

SELECTIVE PER DIE PERFORMANCE BINNING

TECHNICAL FIELD

Examples of the present disclosure generally relate to assembling a multi-die device using dies binned according to performance values.

BACKGROUND

A customer may order a multi-die device (also referred to as a package) that includes a feature such as a specific type of input/output (I/O) interface. For example, the I/O interface may be a PCIe interface, a serializer/deserializer (SerDes) interface, a transmitter, a memory interface and the like. The dies in the multi-die device may each include this feature. However, the customer may request the feature have a specific performance such as a minimum data rate at low voltage. Stated differently, the customer may want the feature to transmit the maximum possible data but do it at low voltage in order to conserve power. However, because of variations in the manufacturing process, a small percentage of the dies have features that satisfy this performance. As such, if the multi-die device needs multiple dies which each satisfy the requested performance, the yield of the device can be very low and many of the fabricated dies cannot be used.

SUMMARY

Techniques for assembling a multi-die chip are described. One example is a method that includes testing a plurality of dies having the same circuit layout and formed using the same fabrication processes to identify performance values for at least one feature in the plurality of dies, binning the plurality of dies according to the performance values, identifying a critical performance value of the at least one feature for a multi-die device, identifying a first location in the multi-die device requiring the at least one feature to have the critical performance value, identifying a second location in the multi-die device permitting the at least one feature to have a lower performance value than the critical performance value, selecting a first die of the plurality of dies for the first location and a second die of the plurality of dies for the second location based on binning the plurality of dies, placing the first die at the first location and the second die at the second location, and assembling the multi-die device.

One example described herein is a multi-die device that includes a first die and a second die communicatively coupled to the first die where the first and second dies have the same circuit layout and are formed using the same fabrication processes. Moreover, the first die and the second die both have a same feature, wherein the feature on the first die has a performance value that meets or exceeds a critical performance value and the feature on the second die has a lower performance value than the critical performance value. In addition, the feature in the first die is communicatively coupled to at least one of a reserved output connection of the multi-die device and an ancillary die in the multi-die device.

One example described herein is a computer readable storage medium that includes computer-readable program code for assembling a multi-die device, where, when executed by a computing processor, the computer-readable program code performs an operation that includes testing a plurality of dies having the same circuit layout and formed using the same fabrication processes to identify performance values for at least one feature in the plurality of dies, binning the plurality of dies according to the performance values, identifying a critical performance value of the at least one feature for a multi-die device, identifying a first location in the multi-die device requiring the at least one feature to have the critical performance value, identifying a second location in the multi-die device permitting the at least one feature to have a lower performance value than the critical performance value, selecting a first die of the plurality of dies for the first location and a second die of the plurality of dies for the second location based on binning the plurality of dies, and outputting instructions to place the first die at the first location and the second die at the second location.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 7 illustrates a layout of a multi-die device with die locations assigned to performance values, according to an example.

FIG. 8 illustrates a layout of a multi-die device with die locations assigned to performance values, according to an example.

FIG. 9 illustrates a layout of a multi-die device with die locations assigned to performance values, according to an example.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
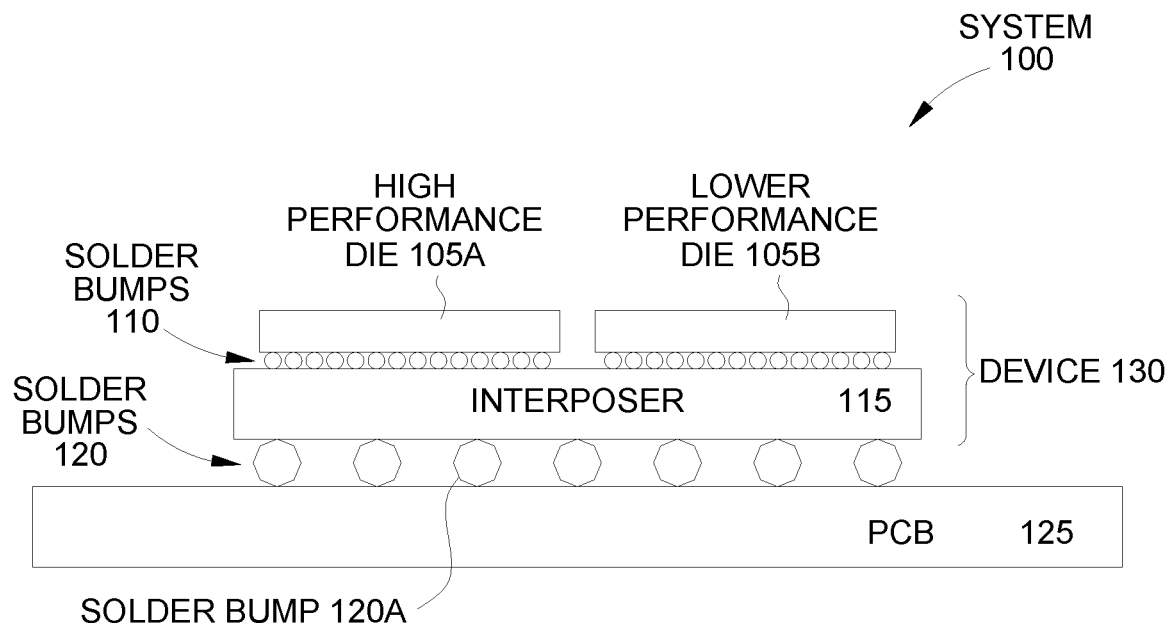
FIG. 1 is a side view of a system that includes a multi-die device, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe binning and placement techniques for assembling a multi-die device to improve yield when a customer requests a high performance feature for the device. For example, the multi-die device may include multiple dies that are interconnected to form a single device or package. In one embodiment, the multiple dies are the same semiconductor die (e.g., a field programmable gate array (FPGA), programmable logic device, application specific integrated circuit (ASIC), accelerator, etc.) and are disposed on a common interposer or stacked on each other. The multi-die device can then be attached to a printed circuit board (PCB).

Although the dies in the multi-die device may each include the same feature (e.g., a PCIe interface, SerDes interface, transceiver, memory interface, etc.), the multi-die device is assembled such that only one of the dies has a feature that satisfies the high performance requested by the customer. That is, instead of all of the dies in the multi-die device having features which satisfy the customer's request, only one of the dies may have a high performance feature while the remaining dies may have lower performing features. For example, a first location in the multi-die device may be reserved for a die with the high performance feature while the remaining locations in the multi-die device can be occupied by dies with lower performance features. The manufacturer can then stipulate which output connection (or connections) in the multi-die device can be used to access the die with the high performance feature. In this manner, the multi-die device can provide the high performance feature without all of the dies in the device having the high performance feature.

FIG. 1 is a side view of a system 100 that includes a multi-die device 130, according to an example. In this example, the device 130 includes two semiconductor dies 105 which are the same (e.g., made using the same fabrication process and contain the same circuit layout). The dies 105 are disposed on an interposer 115 which can be made from silicon or another suitable material. The dies 105 are bonding to the interposer 115 using solder bumps 110 but other types of connections are possible such as wire bonds. Although not shown, the interposer 115 contains internal traces or routes which provide electrical connection between the dies 105 and a PCB 125. In one embodiment, the interposer 115 also contains traces which provide electrical connections between the two dies 105, although this is not a requirement. The arrangement of the dies 105 on the interposer 115 is referred to herein as a 2.5D arrangement.

In one embodiment, the multi-die device 130 may be disposed on a substrate rather than the interposer 115 which provides electrical connection to other systems. Further, although the dies 105A and 105B are the same in this embodiment, other dies which have different circuitry, layouts, and/or features than the dies 105 may be disposed on the same substrate as the dies 105.

In this example, the die 105A is a high performance die while the die 105B is a lower performance die. In one embodiment, the dies 105A and 105B both have the same features, but for at least one of those features, the feature in the die 105A has a higher performance than the corresponding feature in the die 105B. For example, a customer may desire that an I/O interface used to communicate data between the PCB 125 and the multi-die device 130 can transmit at the maximum allowable data rate but at low voltage or low power. The high performance die 105A has an I/O interface (e.g., the feature) that satisfies this customer request while the I/O interface on the lower performance die 105B may not.

The difference in the performance of the features in the dies 105 may result from variation in fabrication processes. That is, although the dies 105 may be subjected to the same fabrication processes and contain the same components, the location of the dies 105 on a wafer, the environmental conditions in a chamber, the uniformity of the deposited materials, the shape of structures formed on the dies 105, may affect the performance of the features on dies 105. It is very difficult, if not impossible, to ensure all the dies 105 have high performance features, and even if it were possible, it would be prohibitively expensive. As such, only a portion of the fabricated dies 105 on a wafer may have high performance features that satisfy the customer's request for high performance—e.g., maximum data rate while consuming low power.

Some examples of I/O interfaces which have variable performance due to variations in the fabrication processes are PCIe interfaces such as PCI Gen3×8/PCIe Gen 3×16 or Gen4×8, SerDes, transceivers (e.g., 56 Gbps transceivers), and memory interfaces between the dies 105 and separate memory components (e.g., DRAM or SRAM dies). Although the embodiments herein describe features that serve as I/O interfaces, these embodiments can be applied to other types of features in the dies 105 such as processor or clock speeds, internal power consumption, internal memory data rates, and the like. In general, the embodiments herein can be applied to any multi-die device where a feature in the dies 105 can have variable performance.

In one embodiment, the multi-die device 130 has a reserved or dedicated output connection that the customer can use to access the high performance feature in the high performance die 105A. In this example, the multi-die device 130 is connected to the PCB 125 using solder bumps 120. In FIG. 1, the solder bump 120A is reserved as the output connection for the device 130 and is communicatively coupled to the high performance feature in the die 105A. For example, the manufacturer of the multi-die device 130 can inform the customer that it should use the electrical connection established by the solder bump 120A to access the high performance I/O interface in the high performance die 105A. That is, using a trace in the interposer 115, the solder bump 120A (or multiple solder bumps) may be connected to a high performance PCIe interface, SerDes link, or transceiver in the high performance die 105A. In this embodiment, the manufacturer stipulates to the customer which output connection it should use in order to access the high performance feature in the device 130.

In one embodiment, the device 130 does not include an output connection for coupling the lower performance feature in the lower performance die 105B to the PCB 125. That is, the feature in the lower performance die 105B may be unused or inaccessible to the customer via the PCB 125. For example, to the perspective of the customer, the multiple dies 105 in the device 130 may appear as a single chip or die. As such, the customer may have only one high-speed PCIe or SerDes link to the device 130. As such, although both of the dies 105 may include PCIe or SerDes interfaces, only the interface in the high performance die 105 is used to transmit data between the PCB 125 (which may be coupled to an external computing system) and the multi-die device 130. In this example, the interposer 115 may not have an output connection that permits the PCB 125 to directly transmit data to the feature (e.g., the I/O interface) in the lower performance die 105B.

However, in other embodiments, the multi-die device 130 can include output connections that permit the PCB 125 to communicate with both features in the dies 105—i.e., the high performance feature in the die 105A as well as the lower performance feature in the die 105B. For example, another solder bump of the solder bumps 120 may be electrically coupled, via the interposer 115, to the lower performance feature in the die 105B. In this example, the customer may use the same feature (e.g., a PCIe or SerDes interface) in both of the dies 105.

In one embodiment, the multi-die device is assembled using a predefined location for the high performance die 105A. Put differently, the multi-die device 130 has a predefined location (or locations) where one or more high performance dies should be disposed. As shown in FIG. 1, the high performance die 105A is disposed on the left of the interposer 115. Doing so may ensure that the high performance feature in the die 105A is coupled to the solder bump 120A which the customer knows is the solder bump it should use in order to communicate with the high performance feature. If a lower performance die 105B were instead placed at the location of the high performance die 105A, then the customer would communicate with the lower performance feature when using the solder bump 120A. As such, when assembled, the manufacturer ensures that a die 105 that has a high performance feature is disposed in a location in the device 130 such that the high performance feature is coupled to the reserved or designated output connection (e.g., the solder bump 120A, one or more bond pads, or one or more pins).

Figure 2:
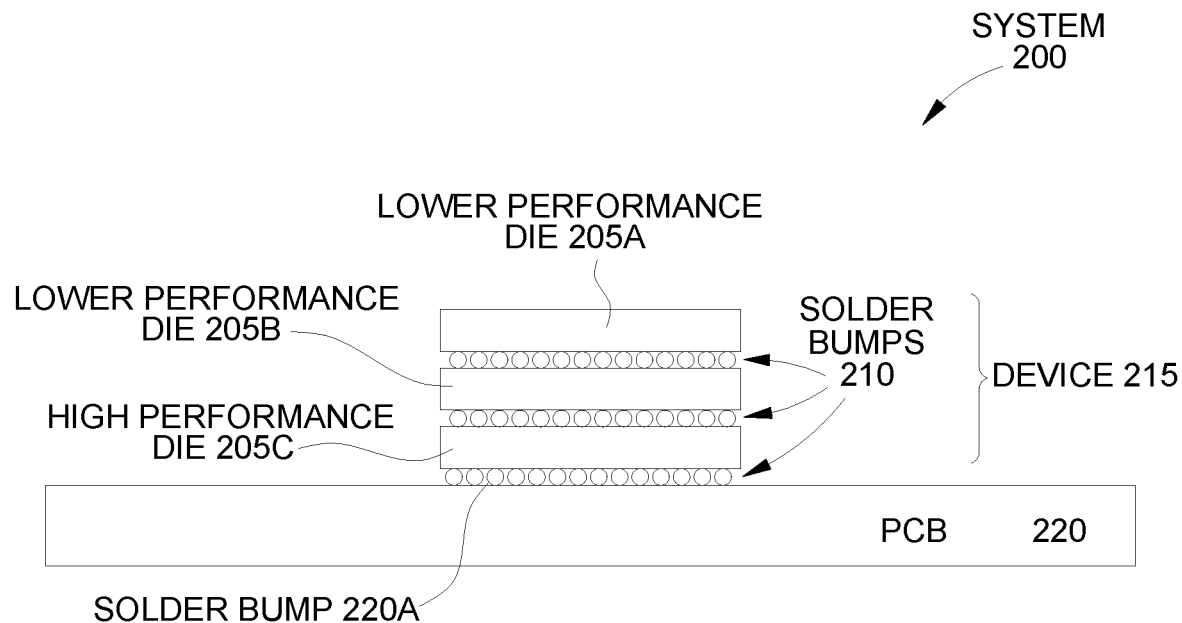
FIG. 2 is a side view of a system that includes a multi-die device, according to an example.

FIG. 2 is a side view of a system 200 that includes a multi-die device 215, according to an example. The device 215 includes multiple semiconductor dies 205 disposed on each other to form a vertical stack. That is, die 205A is stacked on die 205B where solder bumps 210 form electrical connections between the dies. Further, die 205B is stacked on die 205C where again the solder bumps 210 form electrical connections between the dies. In turn, the die 205C is electrically connected using solder bumps 210 to a PCB 220. In this example, the dies 205 in the multi-die device 215 form a 3D arrangement. Using connections in the dies 205 (e.g., through silicon vias), each of the dies 205 can communicate with each other and the PCB 220. That is, using connections in the die 205C, the PCB 220 can communication with the die 205B. Further, using connections in the dies 205B and 205C, the PCB 220 can communicate with the die 205A. In this arrangement, an interposer may be omitted.

In one embodiment, the dies 205 are the same (e.g., made using the same fabrication process and contain the same layout and circuitry). That is, the dies 205 may be the same FPGA, ASIC, processor, memory die, PLC, etc. which have the same features and circuitry. However, as explained above, due to variations in the fabrication processes, the features and circuitry in the dies 205 may have different performance values. In this example, the die 205C includes at least one feature that has higher performance than that same feature in the dies 205A and 205B, and as such, is labeled as a high performance die. As discussed above, the high performance feature can be an I/O interface (e.g., a PCIe interface, SerDes interface, transceiver, or memory interface) or other features such as processor speed, clock speed, internal memory data transfer rate, and the like.

In one embodiment, the manufacturer informs the customer of a reserved or dedicated output connection for accessing the high performance feature in the high performance die 205C. In this example, the solder bump 210A is indicated as the reserved output connection that permits the PCB 220 to communication with the high performance feature in the die 205C. In other example, the output connection may be multiple solder bumps, one or more bond pads, or one or more connection pins. The customer may form the PCB 220 such that data destined for the high performance feature is routed through the solder bump 210A. Although not shown, the PCB 220 can be coupled to a computing system which communicates with the device 215 via the PCB 220.

In one embodiment, the multi-die device 215 does not include an output connection for coupling the lower performance features in the lower performance dies 205B and 205C to the PCB 220. That is, the lower performance features in the dies 205B and 205C may be unused or inaccessible to the customer via the PCB 220. In this example, none of the solder bumps 210 disposed between the die 205C and the PCB 220 permit the customer to transmit data to the lower performance features (e.g., I/O interfaces) in the lower performance dies 205A and 205B. However, in other embodiments, the multi-die device 215 can include output connections (e.g., solder bumps 210, bond pads, or connection pins) that permit the PCB 220 to communicate with the same feature in all three of the dies 205—i.e., the high performance feature in the die 205C as well as the lower performance features in the dies 205A and 205B.

Like the multi-die device 130 in FIG. 1, the multi-die device 215 in FIG. 2 is assembled using a predefined location for the high performance die 205C. Put differently, the multi-die device 215 has a predefined location (or locations) where one or more high performance dies should be disposed. As shown in FIG. 2, the high performance die 205C is disposed on the bottom of the stack closest to the PCB 220. Doing so may ensure that the high performance feature in the die 205C is coupled to the solder bump 210A which the customer knows is the solder bump it should use in order to communicate with the high performance feature. If a lower performance die 205A or 205B were instead placed at the location of the high performance die 205C, then the customer would communicate with the lower performance feature when using the solder bump 210A. As such, when assembled, the manufacturer ensures that a die 205 that has a high performance feature is disposed in a location in the device 215 such that the high performance feature is coupled to the reserved or designated output connection (e.g., the solder bump 120A, one or more bond pads, or one or more pins). Although in FIG. 2, the reserved location of the high performance die 205C is at the bottom of the stack, this is not a requirement. The device 215 can be designed such that the reserved location may be any location in the stack and still be coupled to the reserved output connection for accessing the high performance feature—e.g., the solder bump 210A.

Figure 3:
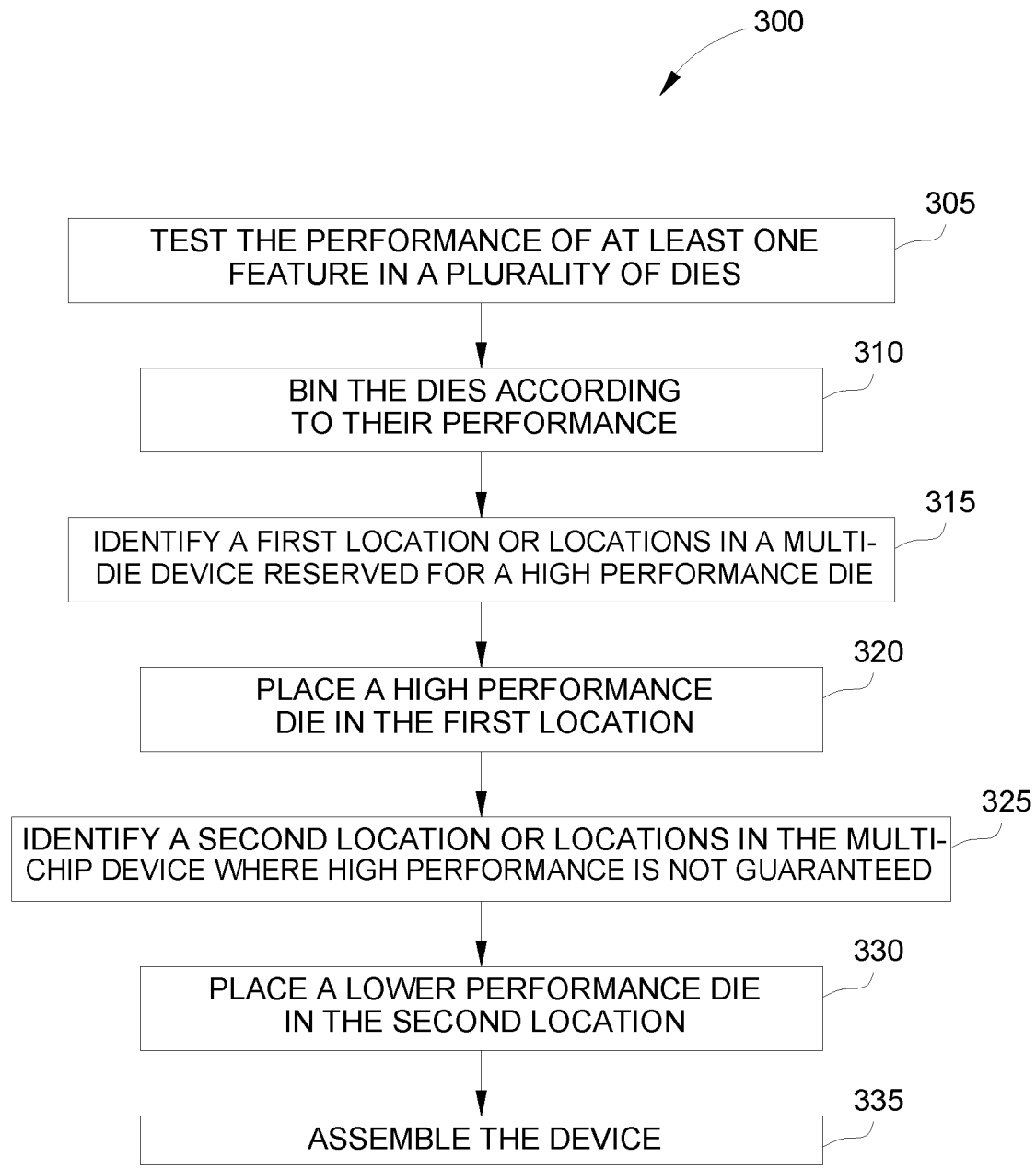
FIG. 3 is flowchart for assembling a multi-die device, according to an example.

FIG. 3 is flowchart of a method 300 for assembling a multi-die device, according to an example. The method 300 assumes that a manufacturer has already fabricated a plurality of dies using the same fabrication process. For example, the plurality of dies may be formed on the same wafer (or wafers) which, after the dies are formed, can be cleaved or sawed in order to form the multiple dies illustrated in FIGS. 1 and 2.

At block 305, the manufacturer tests the performance of at least one feature in the plurality of dies. In one embodiment, the manufacturer tests the dies while the dies are still part of the same wafer. Alternatively, the testing is performed after the wafer or wafers are cleaved or sawed to form individual dies.

The dies are coupled to a testing apparatus which uses a predefined test program to identify the performance of a feature in the dies such as an I/O interface, maximum clock speed, internal memory data rates, power consumption, and the like. For example, the testing apparatus can test the data rate or data throughput of an I/O interface at different voltages—e.g., low voltage and high voltage. For example, an I/O interface on a first die can operate at the maximum data rate when operating at high voltage but can only operate at a medium data rate when operating at low voltage. Alternatively, that same I/O interface on a second die can operate at the maximum data rate when operating at low voltage. As such, the I/O interface on the second die has a higher performance than the I/O interface on the first die.

At block 310, the manufacturer bins the dies according to their performance. For example, the manufacturer may assign a performance value to the feature (or features) that were tested at block 305. Using the performance value, the manufacturer can assign each die to a bin—e.g., a lower performance bin and a higher performance bin. The dies can be assigned to a bin based on the performance value of a single feature or based on a combination of performance values of multiple features in the dies.

Figures 4, 5, 6:
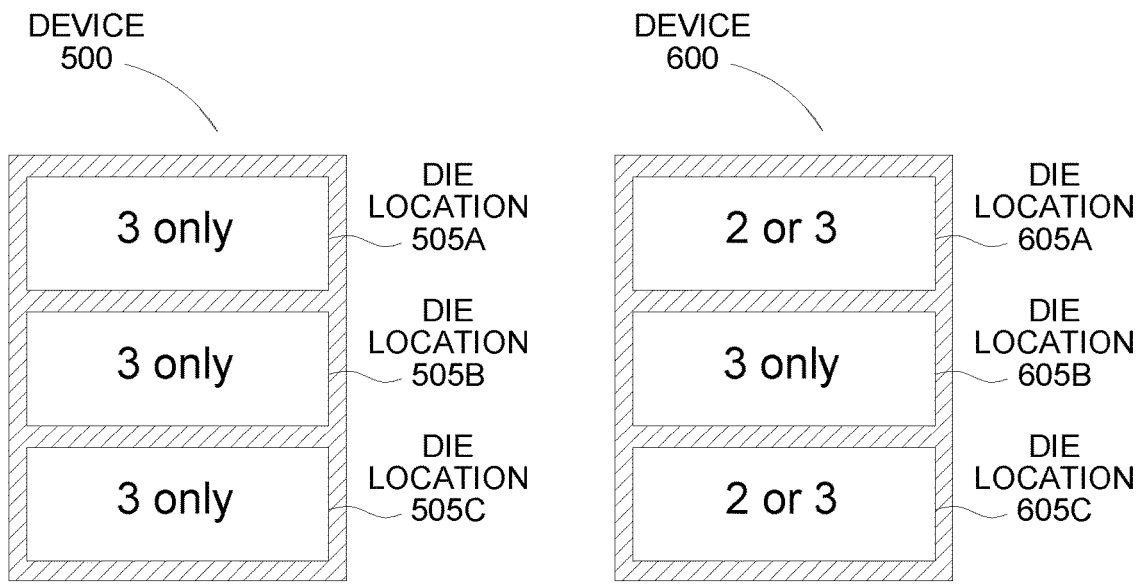
FIG. 4 illustrates an inventory containing dies binned according to performance values, according to an example.
FIG. 5 illustrates a layout of a multi-die device with die locations assigned to bins, according to an example.
FIG. 6 illustrates a layout of a multi-die device with die locations assigned to bins, according to an example.

FIG. 4 illustrates an inventory 400 containing dies 105 binned according to performance values, according to an example. That is, each box in FIG. 4 represents a die 105 in inventory 400. As shown, each die 105 is assigned to a bin 405—i.e., 1, 2 or 3. As described above, the dies 105 are assigned to a bin 405 using the performance value of a feature (or features) identified when testing the dies 105. For example, the dies 105 in Bin 3 may have a PCIe interface that satisfies the Gen3×16 standard or specification when operating at low voltage. However, the dies in Bin 2 may have a PCIe interface that satisfies the Gen3×16 specification when operating at high voltage (but not when operating at low voltage). The dies 105 in Bin 1 may have a PCIe interface that does not satisfy the Gen 3×16 specification regardless of the operation voltage. In one embodiment, the dies 105 assigned to Bin 1 may not be used in any devices, or may be used in devices that can have dies 105 with slower PCIe interfaces.

The inventory 400 indicates that only a portion of the dies 105 are assigned to Bin 3—i.e., the high performance bin. That is, around 20% of the dies 105 have features with a performance value or values that satisfy the requirements for Bin 3. In contrast, around 70% of the dies 105 have features with performance values that satisfy the requirements of Bin 2 and around 10% of the dies 105 have features with performance values that satisfy the requirements of Bin 1. As such, if a customer wants a multi-die device where all the dies have the high performance feature—i.e., all the dies used in the device are in Bin 3—only 20% of the inventory 400 can be used to assembly the devices while the remaining 80% of the dies 105 cannot. As such, the yield from the inventory 400 is very low. Nonetheless, the customer could use any of the dies 105 in the multi-die device to access the high performance feature.

However, as discussed above, in many cases only one of the dies 105 in the device needs the high performance feature. That is, the device may use the PCIe interface, SerDes interface, or transceiver in only one of the dies in the device. The PCIe interfaces, SerDes interfaces, or transceivers in the other dies in the multi-die device may be unused. Thus, selecting only dies 105 in Bin 3 to assemble the multi-die device may be unnecessary.

Using the method 300, a manufacturer can select only one of the dies 105 in Bin 3 to include in each multi-die device while the remaining dies can include dies 105 in Bin 2 or Bin 1 (if permissible). Thus, instead of every multi-die device using N dies 105 in Bin 3 (where N is the total number of dies in a device), each device needs only one die 105 in Bin 3 while the remaining N−1 dies can be selected from a lower performance bin. As such, the yield of the multi-die devices is increased by a multiple of N. For example, if N=3, then the inventory 400 can be used to assemble 3 times as many multi-die devices as it would if every die in the devices is selected from Bin 3. Stated differently, the manufacturer goes from a yield of approximately 20% to a yield of approximately 60% using the inventory 400 in FIG. 4. As such, the cost of manufacturing the multi-die devices is significantly decreased.

Returning to the method 300, at block 315 the manufacturer identifies a first location (or locations) in a multi-die device reserved for a high performance die (e.g., a die 105 assigned to Bin 3 in FIG. 4). As part of this block, a system designer or customer may designate a critical performance value for one of the features in the dies. The manufacture can use the critical performance value to then compare to the binned dies to see which have a high performance feature (e.g., a feature that meets or exceeds the critical performance value) or a low performance feature (e.g., a feature that has a lower performance value than the critical performance value). As mentioned above, a particular die location in the multi-die devices is reserved for a high performance die (which has a high performance feature that meets or exceeds the critical performance value) where that location is connected to a corresponding output connection in the multi-die device reserved or designated by the manufacturer as the means for communicating with the high performance feature. Put differently, the manufacture identifies a first location in the multi-die device requiring a feature to have the critical performance value.

As shown in FIG. 1, the first, reserved location of the high performance die 105A is the left location above the interposer 115. The interposer 115 includes a trace that permits the high performance feature in the die 105A at the left location to communicate with the reserved solder bump 120A. The customer can design the PCB 125 to use the solder bump 120A to communicate with the high performance feature and then attach the PCB 125 to the device 130.

As shown in FIG. 2, the first, reserved location of the high performance die 205C is the bottom location in the vertical stack. Placing the high performance die at this location ensures that the solder bump 210A (i.e., the reserved output connection) is attached to the high performance feature in the die 205C.

In one embodiment, only one die location in the multi-die device is reserved for a high performance die while the remaining die location or locations can be filled with lower performance dies. However, in other embodiments, a multi-die device may have multiple locations reserved for high performance dies.

At block 320, the manufacturer places a high performance die in the first location. For example, the manufacturer may place the high performance die on a particular location on an interposer when using a 2.5D arrangement or in a particular location in a vertical stack when using a 3D arrangement.

At block 325, the manufacturer identifies a second location (or locations) in the multi-die device where high performance is not guaranteed. Put differently, the manufacturer identifies a second location permitting the feature to have a lower performance value than the critical performance value. That is, the customer may not use the lower performing I/O features of the die disposed in the second location, or may use these features understanding they may provide a lower data rate or have to be operated at a higher voltage in order to achieve the maximum data rate. Referring the FIG. 1, the second location is the right location which contains the lower performance die 105B. In FIG. 2, the second location is the middle location in the vertical stack or the top location (or both) which contain the lower performance dies 205A and 205B.

At block 330, the manufacturer places a lower performance die in the second location. In one embodiment, the lower performance die is a die assigned to any other bin besides Bin 3 in FIG. 4 such as Bin 1 or Bin 2. Once all locations of the multi-die device have been filled with dies, at block 335 the multi-die device is assembled. For example, the dies may be attached to an interposer to form a 2.5D arrangement or attached to each other to form a 3D arrangement. Moreover, the dies may be encased in a protective resin. Further, the multi-die device may be sold as a package to a customer who then attaches the device to a respective PCB, or the manufacturer may attach the device to a PCB before shipping it to a customer.

FIG. 5 illustrates a layout of a multi-die device 500 with die locations 505 assigned to bins, according to an example. The device 500 includes three die locations 505A-C which each require a high performance die—i.e., a die 105 assigned to Bin 3. However, this reduces the yield by N times since each die in the device 500 is required to include a high performance die. This may be a less optimal use of the dies. For example, the customer may use the high performance feature from only one of the dies, in which case, the other two dies may not need to be high performance dies.

FIG. 6 illustrates a layout of a multi-die device 600 with die locations 605 assigned to bins, according to an example. In this example, only die location 605B is reserved for a high performance die—i.e., a die assigned to Bin 3. Thus, when a die is disposed at the location 605B, that die is connected to a reserved output connection of the device 600 which the customer can connect with to access the high performance feature in the die. The locations 605A and 605C, on the other hand, can include lower performance dies—i.e., a die assigned to Bin 2 or lower. While a high performance die can be disposed in these locations (and may be if the inventory includes a surplus of dies assigned to Bin 3), it may improve yield by placing a lower performance die at the locations 605A and 605C. That is, using the layout shown in FIG. 6 relative to the layout in FIG. 5, increases the number of available dies in Bin 3 by a multiple of 3 since only one location 605 is reserved for a high performance die rather than all three.

FIG. 7 illustrates a layout of a multi-die device 700 with die locations 705 assigned to performance values, according to an example. In this example, the die location 705B is reserved for a high performance die while the locations 705A and 705C can be a middle (mid) performance die or a high performance die. Thus, the layout in FIG. 7 has similar constraints and advantages as the layout illustrated in FIG. 6.

FIG. 8 illustrates a layout of a multi-die device 800 with die locations 805 assigned to performance values, according to an example. FIG. 8 is similar to FIG. 7 where one location (i.e., the die location 805C) is reserved for a die with a high performance feature. The remaining locations—i.e. locations 805A, 805B, and 805D—can be occupied by dies with either lower performance features or high performance features.

FIG. 8 illustrates that the device 800 can have more than three dies, e.g., four, five, six, etc. Moreover, although one location is reserved for a high performance die, in other examples, two or three of the locations 805 may be reserved for high performance dies while the remaining location or locations 805 can be lower performance dies. Although FIGS. 7 and 8 illustrate placing the same types of die (albeit with varying performances) at different locations in a device, the devices could also include other types of dies. For example, the devices may include other locations on the interposer or in a stack for dies that have different layouts and different features than the dies placed in the locations 705 and 805 shown in FIGS. 7 and 8.

FIG. 9 illustrates a layout of a multi-die device 900 with die locations 905 assigned to performance values, according to an example. The device 900 also includes ancillary die locations 910 for ancillary dies 915 which can be memory dies (e.g., DRAM or SRAM chips), accelerators, controllers, and the like. In this example, the dies in the locations 905 may each have communication interfaces for transferring data with the ancillary dies 915 at the locations 910. However, in one embodiment, only one of the locations 905 is tasked with communicating with the ancillary dies 915. In this example, the die disposed at location 905C communicates directly with the ancillary dies 915 at the locations 910A and 910B while the dies at locations 905A and 905B do not directly communicate with the ancillary dies 915. Instead, the dies at the locations 905A and 905B may communicate with the ancillary dies 915 through the die at the location 905C. For example, if the ancillary dies 915 are high speed memory dies, the dies at locations 905A and 905B may use a high performance memory interface in the die at location 905C to communicate with the ancillary dies 915. Thus, the die at the location 905C may have a high speed memory interface while the dies at the locations 905A and 905B can have lower performance memory interfaces (which may be unused). Thus, FIG. 9 illustrates that the techniques described herein can be applied to features in the dies (e.g., communication interfaces) which enable communication to other dies within the multi-die device (e.g., internal communication) in addition to features that permit communication with a component outside of the device (e.g., a PCB).

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects described herein may take the form of an entirely hardware embodiment, an entirely software embodiment (including firmware, resident software, micro-code, etc.) or an embodiment combining software and hardware aspects that may all generally be referred to herein as a "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, FPGAs, or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method, comprising:
    testing a plurality of dies having the same circuit layout and formed using the same fabrication processes to identify performance values for at least one feature in the plurality of dies;
    binning the plurality of dies according to the performance values;
    identifying a critical performance value of the at least one feature for a multi-die device;
    identifying a first location in the multi-die device requiring the at least one feature to have the critical performance value;
    identifying a second location in the multi-die device permitting the at least one feature to have a lower performance value than the critical performance value;
    selecting a first die of the plurality of dies for the first location and a second die of the plurality of dies for the second location based on binning the plurality of dies;
    placing the first die at the first location and the second die at the second location; and
    assembling the multi-die device.

2. The method of claim 1, wherein binning the plurality of dies further comprises:
    assigning each of the plurality of dies to one of a plurality of bins according to the performance values, wherein a first bin of the plurality of bins contains only high performance dies that have performance values that meet or exceed the critical performance value, wherein the first die is assigned to the first bin, and wherein a second bin of the plurality of bins contains lower performance dies, wherein the second die is assigned to the second bin.

3. The method of claim 2, wherein each of the plurality of dies is assigned to only one of the plurality of bins.

4. The method of claim 1, further comprising:
    connecting, after placing the first die at the first location, the first die to a reserved output connection of the multi-die device, wherein the reserved output connection is assigned to be used to access the at least one feature in the first die.

5. The method of claim 4, wherein the at least one feature is an I/O interface that permits the plurality of dies to communicate with a component external to the multi-die device.

6. The method of claim 5, wherein the I/O interface in the first die is connected to the external component, and wherein the I/O interface in the second die is not connected to any component external to the multi-die device.

7. The method of claim 1, further comprising:
    connecting, after placing the first die at the first location, the first die to an ancillary die in the multi-die device, wherein the ancillary die has a different layout and is formed using a different fabrication process than the first and second dies.

8. The method of claim 7, wherein the at least one feature is a communication interface that permits the plurality of dies to communicate with the ancillary die in the multi-die device.

9. The method of claim 8, wherein the communication interface in the first die is connected to the ancillary die, and wherein the communication interface in the second die is not connected to any ancillary die in the multi-die device.

10. A method, comprising:
    binning a plurality of dies according to performance values for at least one feature in the plurality of dies, the plurality of dies having the same circuit layout and formed using the same fabrication processes, the performance values being obtained by testing the plurality of dies;
    identifying a critical performance value of the at least one feature for a multi-die device;
    identifying a first location in the multi-die device requiring the at least one feature to have the critical performance value;
    identifying a second location in the multi-die device permitting the at least one feature to have a lower performance value than the critical performance value;
    selecting a first die of the plurality of dies for the first location and a second die of the plurality of dies for the second location based on binning the plurality of dies; and
    causing the multi-die device to be assembled including causing the first die to be placed at the first location and the second die to be placed at the second location.

11. The method of claim 10, wherein binning the plurality of dies further comprises:
    assigning each of the plurality of dies to one of a plurality of bins according to the performance values, wherein a first bin of the plurality of bins contains only high performance dies that have performance values that meet or exceed the critical performance value, wherein the first die is assigned to the first bin, and wherein a second bin of the plurality of bins contains lower performance dies, wherein the second die is assigned to the second bin.

12. The method of claim 11, wherein each of the plurality of dies is assigned to only one of the plurality of bins.

13. The method of claim 10, wherein causing the multi-die device to be assembled further includes:
    causing, after the first die is placed at the first location, the first die to be connected to a reserved output connection of the multi-die device, wherein the reserved output connection is assigned to be used to access the at least one feature in the first die.

14. The method of claim 13, wherein the at least one feature is an I/O interface that permits the plurality of dies to communicate with a component external to the multi-die device.

15. The method of claim 14, wherein the I/O interface in the first die is caused to be connected to the external component, and wherein the I/O interface in the second die is caused to not be connected to any component external to the multi-die device.

16. The method of claim 10, wherein causing the multi-die device to be assembled further includes:
    causing, after the first die is placed at the first location, the first die to be connected to an ancillary die in the multi-die device, wherein the ancillary die has a different layout and is formed using a different fabrication process than the first and second dies.

17. The method of claim 16, wherein the at least one feature is a communication interface that permits the plurality of dies to communicate with the ancillary die in the multi-die device.

18. The method of claim 17, wherein the communication interface in the first die is caused to be connected to the ancillary die, and wherein the communication interface in the second die is caused to not be connected to any ancillary die in the multi-die device.

* * * * *